(12) United States Patent
Okada

(10) Patent No.: US 6,411,518 B1
(45) Date of Patent: Jun. 25, 2002

(54) HIGH-DENSITY MOUNTED DEVICE EMPLOYING AN ADHESIVE SHEET

(75) Inventor: Masaaki Okada, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/634,499

(22) Filed: Aug. 8, 2000

(30) Foreign Application Priority Data

Feb. 1, 2000 (JP) ........................................ 2000-023855

(51) Int. Cl.[7] ................................................ H05K 7/06
(52) U.S. Cl. ........................ 361/771; 361/719; 361/767; 361/768; 174/259; 174/264; 257/698; 257/720; 257/778
(58) Field of Search ................................ 361/719, 720, 361/767, 768, 771; 257/691, 698, 707, 713, 720, 723, 724, 778; 74/260, 262, 264; 438/108, 118, 119, 122; 174/259

(56) References Cited

U.S. PATENT DOCUMENTS

| | | | | |
|---|---|---|---|---|
| 4,667,219 A | * | 5/1987 | Lee et al. | 257/698 |
| 5,068,714 A | * | 11/1991 | Seipler | 438/119 |
| 5,283,468 A | * | 2/1994 | Kondo et al. | 257/698 |
| 5,543,661 A | * | 8/1996 | Sumida | 257/713 |
| 5,710,459 A | * | 1/1998 | Teng et al. | 257/713 |
| 5,808,874 A | * | 9/1998 | Smith | 361/771 |
| 5,818,700 A | * | 10/1998 | Purinton | 257/720 |
| 5,870,289 A | * | 2/1999 | Tokuda et al. | 361/771 |
| 5,872,338 A | * | 2/1999 | Lan et al. | 174/260 |
| 5,982,630 A | * | 11/1999 | Bhatia | 361/719 |
| 6,008,536 A | * | 12/1999 | Mertol | 257/713 |
| 6,038,137 A | * | 3/2000 | Bhatt et al. | 361/719 |
| 6,093,476 A | * | 7/2000 | Horiuchi et al. | 174/262 |
| 6,137,164 A | * | 10/2000 | Yew et al. | 257/778 |
| 6,191,477 B1 | * | 2/2001 | Hashemi | 257/698 |
| 6,258,627 B1 | * | 7/2001 | Benenati et al. | 438/118 |
| 6,278,181 B1 | * | 8/2001 | Maley | 257/778 |

FOREIGN PATENT DOCUMENTS

JP 62254455 11/1987

* cited by examiner

*Primary Examiner*—Albert W. Paladini
*Assistant Examiner*—John B. Vigushin
(74) *Attorney, Agent, or Firm*—Rothwell, Figg, Ernst & Manbeck

(57) ABSTRACT

A high-density mounted device, in which a plurality of semiconductor devices such as semiconductor element or module boards, are mounted on a wiring board, includes an adhesive sheet which is interposed between the wiring board and the semiconductor device. The adhesive sheet has a sheet-like base board made of an adhesive member and a plurality of conductive Sections provided at predetermined pitches in the sheet-like base member. The conductive sections are electrically insulated from each other, and extend from one side of the sheet-like base member to the other side thereof, and enable electrical connection between the electrode terminals of the wiring board and the electrode terminals of the semiconductor device. The conductive sections work as heat conductive channels between the wiring board and the semiconductor device. Thus, a high-density mounted device is provided which enables sufficient electrical and mechanical connection between a wiring board and a semiconductor device to be mounted thereon and sufficient grounding of the semiconductor device and the wiring board.

10 Claims, 2 Drawing Sheets

HIGH-DENSITY MOUNTED DEVICE EMPLOYING AN ADHESIVE SHEET

BACKGROUND OF THE INVENTION

1. Field of the Invention

The present invention relates to a high-density mounted device, and more particularly, to a high-density mounted device in which an adhesive sheet is laid between a wiring board and a plurality of semiconductor devices to be mounted thereon.

2. Background Art

FIG. 4 is a cross-sectional view showing a method of mounting a semiconductor device for use with a conventional high-density mounted device. In the drawing, reference numeral 1 designates a wiring board formed from glass epoxy or ceramic; 2 designates a plurality of electrode terminals provided on the primary surface of the wiring board; 3 designates a semiconductor device to be mounted on the wiring board 1; and 4 designates solder balls which are provided on respective un-illustrated electrode terminals of the semiconductor device 3 and arranged in what is commonly called a ball grid array (BGA). Such a solder ball is typified by Sn—Pb.

The semiconductor device 3 is mounted on the wiring board 1 by providing the solder balls 4 on the semiconductor device 3 so as to correspond to the respective electrode terminals 2 provided on the wiring board 1, attaching the solder balls 4 to solder paste which as been applied to the wiring board 1 beforehand, and fusing the solder balls 4 and the solder paste, to thereby electrically and mechanically connect the solder balls 4 with the respective electrode terminals 2.

As mentioned above, in the conventional high-density mounted device, a semiconductor device is electrically and mechanically connected to a wiring board through use of solder balls. Since the solder balls 4 are connected with the wiring board 1 by way of point contact, sufficient dissipation of heat developing in the semiconductor package has not been achieved.

In a case where a semiconductor device is a high-frequency circuit, grounding is necessary. Even in such a case, a solder ball is provided on the ground terminal of a semiconductor device, in the same way as mentioned above, and the solder ball is bonded to a ground terminal pattern laid on the wiring board 1, thus resulting in insufficient grounding. As a result, the semiconductor device encounters a problem of an operation circuit being unstable or susceptible to noise.

SUMMARY OF THE INVENTION

The present invention has been conceived to solve such a problem and is aimed at providing a high-density mounted device enabling sufficient electrical connection, sufficient heat dissipation, an improvement in grounding, and facilitated mounting of a high density mounted device.

According to one aspect of the present invention, a high-density mounted device comprises a wiring board having a plurality of electrode terminals, and a plurality of semiconductor devices having a plurality of electrode terminals and mounted on the wiring board. An adhesive sheet is interposed between the wiring board and the semiconductor device, and the adhesive sheet includes a sheet-like adhesive base member and a plurality of conductive sections provided at predetermined pitches in the sheet-like adhesive base member. The conductive sections in the adhesive sheet extend from one side of the sheet-like adhesive base member to the other side thereof, and are electrically insulated from each other. The conductive sections enable electrical connection between the electrode terminals of the wiring board and the electrode terminals of the semiconductor device, and constitutes heat conductive channels between the wiring board and the semiconductor device.

According to another aspect of the present invention, in a high-density mounted device, the conductive sections in a adhesive sheet enables electrical connection between the ground terminals of the wiring board and the ground terminals of the semiconductor devices.

Other features and advantages of the invention will be apparent from the following description taken in connection with the accompanying drawings.

DETAILED DESCRIPTION OF THE PREFERRED EMBODIMENTS

First Embodiment

Figure 1:
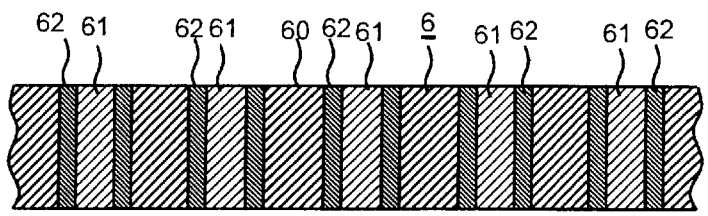
FIG. 1 is an enlarged cross-sectional view showing a structure of an adhesive sheet which constitutes the principal element of the high-density mounted device according to a first embodiment of the present invention.
Figure 2:
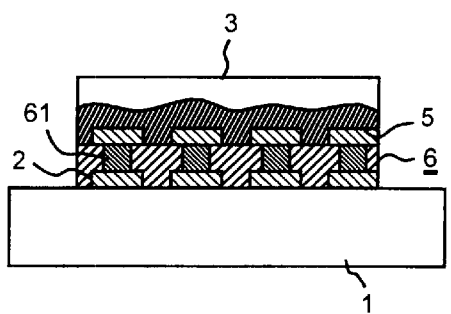
FIG. 2 is a cross-sectional view showing a structure of a high-density mounted device of the first embodiment when an adhesive sheet is employed for the high-density mounted device.

A high-density mounted device according to a first embodiment of the present invention will now be described by reference to the accompanying drawings. FIG. 1 is an enlarged cross-sectional view showing a structure of an adhesive sheet which constitutes the principal element of the high-density mounted device of the first embodiment. FIG. 2 is a cross-sectional view showing a structure of a high-density mounted device of the first embodiment when an adhesive sheet is employed for the high-density mounted device.

In FIG. 2, reference numeral 1 designates a wiring board formed from glass epoxy or ceramic; 2 designates a plurality of electrode terminals provided on the principal surface of the wiring board 1; 3 designates a semiconductor device to be mounted on the wiring board 1, such as a semiconductor element, semiconductor package or module board; 5 designates a plurality of electrode terminals of the semiconductor device 3; and 6 designates an adhesive sheet to be interposed between the semiconductor device 3 and the wiring board 1.

The adhesive sheet 1 has a structure such as that shown in FIG. 1. Reference numeral 60 designates an adhesive base member which constitutes the base of the adhesive sheet and is formed from adhesive thermoplastic or like material; and 61 designates conductive sections which are provided in the base member 60 at predetermined intervals of, for example, 7 μm, and are made of metal, such as copper. Each of the conductive sections 61 assumes a cylindrical shape which extends in a thicknesswise direction from one side of the base member 60 to the other side thereof. Reference numeral 62 designates a cylindrical insulation section which has a thickness of about 1 μm and surrounds the outer circumference of the cylindrical conductive section 61, thus serving as an insulation layer between conductive sections 61.

The adhesive sheet 6 having the foregoing structure is interposed between the wiring board 1 and the semiconductor device 3. The wiring board 1 having the semiconductor device 3 mounted thereon is heated, and pressure is applied to the wiring board 1 in the direction in which the semiconductor device 3 is mounted on the wiring board 1, thereby integrally bonding together the adhesive sheet 6, the wiring board 1, and the semiconductor element 3.

As shown in FIG. 2, only one conductive section 61 is shown between one electrode terminal 2 and its corresponding one electrode terminal 5. In reality, a plurality of conductive sections 61 are located between a pair of electrode terminals 2 and 5, thereby constituting a plurality of electrical and heat conducting channels. Therefore, the heat developed in the semiconductor device 3 can be sufficiently dissipated toward the wiring board 1.

Second Embodiment

Figure 3:
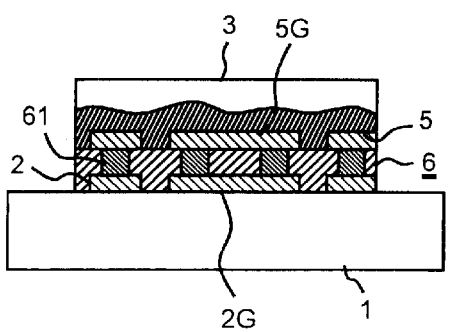
FIG. 3 is a cross-sectional view showing a structure of a high-density mounted device according to a second embodiment.
Figure 4:
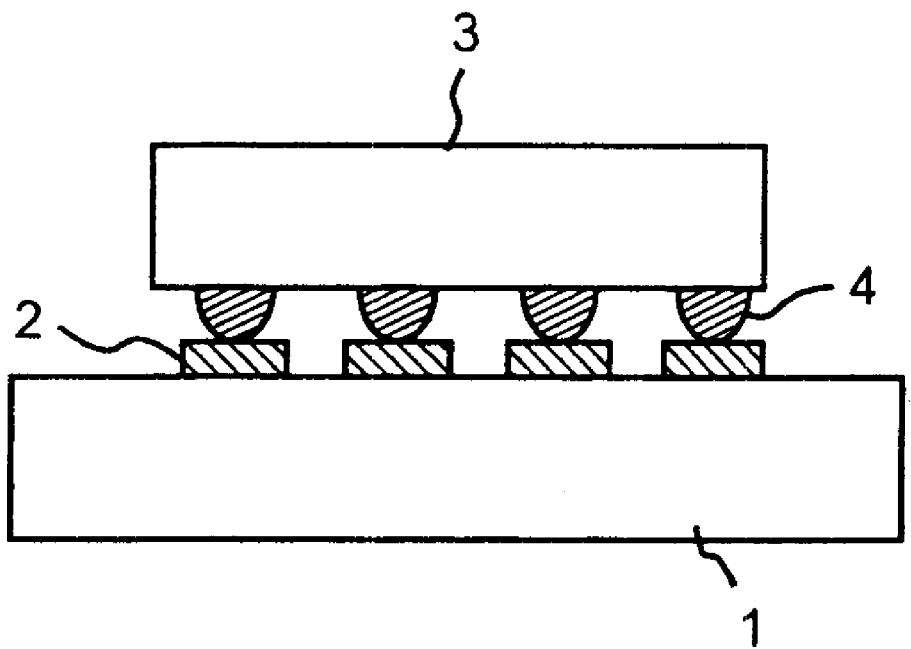
FIG. 4 is a cross-sectional view showing the structure of a high-density mounted device according to the conventional art.

A high-density mounted device according to a second embodiment of the present invention will now be described. FIG. 3 is a cross-sectional view showing a structure of a high-density mounted device according to the second embodiment. In the drawing, reference numerals the same as those in FIGS. 1 and 2 designate like or corresponding elements, and repetition of their explanations is omitted.

The high-density mounted device according to the second embodiment differs from that shown in FIG. 2 in that a ground terminal is provided on the surface of the wiring board 1 and the surface of the semiconductor device 3 in the same plane as that in which the electrode terminals 2 and 5 are provided and in that the ground terminal of the semiconductor device 3 and the ground terminal of the wiring board 1 are connected and grounded by way of the adhesive sheet 6.

In FIG. 3, reference numeral 2G designates a ground terminal pattern formed on the wiring board 1. Since the ground terminal pattern 2G is formed by means of a plurality of terminals scattered and interconnected on the wiring board 1 where no electrode terminals 2 are present, the ground terminal pattern 2G is extended over a wide area and may assume a complicated pattern.

Reference numeral 5G designates a ground terminal provided on the semiconductor device 3. The wiring board 1 and the semiconductor device 3, which have the foregoing structure, are integrally interconnected while the adhesive sheet 6 is interposed therebetween. Since a plurality of conductive sections 61 are provided in the sheet 6 at small intervals, the ground terminal pattern 2G can be connected to the ground terminal 5G of the semiconductor device 3 by means of the conductive sections 61 located in the positions corresponding to the ground terminal pattern 2G, even if the ground terminal pattern 2G assumes a complicated pattern.

Accordingly, the semiconductor device 3 and the wiring board 1 can be sufficiently grounded. Further, even when the semiconductor device is a high-frequency circuit, the device can be prevented from becoming unstable or being susceptible to noise.

The feature and the advantage of the present invention may by summarized as follows.

Since the high-density mounted device of the present invention has the foregoing structure, sufficient electrical and mechanical connection between a wiring board and a semiconductor device to be mounted thereon is achieved, and the heat developing in the semiconductor device can be sufficiently dissipated by way of the wiring board.

Since the adhesive sheet has an adhesive characteristic, a semiconductor device can be readily mounted on a wiring board by application of heat and pressure to the adhesive sheet.

Further, the ground terminal of the semiconductor device can be effectively connected to the ground pattern formed over a wide area of the wiring board, thus strengthening the grounding of the semiconductor device and the wiring board. Consequently, an operation of the semiconductor device can be made stable and resistant to noise.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-23855, filed on Feb. 1, 2000 including specification, claims, drawings and summary, on which the Convention priority of the present application is based, are incorporated herein by reference in its entirety.

What is claimed is:

1. A high-density mounted device, comprising:

a wiring board having a plurality of electrode terminals on an external surface thereof;
a semiconductor device having a plurality of electrode terminals, and
an adhesive sheet interposed between said wiring board and said semiconductor device, said adhesive sheet including a sheet-like adhesive base member and a plurality of conductive sections provided at predetermined pitches in said sheet-like adhesive base member,
said conductive sections extending from one side of said sheet-like adhesive base member to the other side thereof,
said conductive sections being electrically insulated from each other,
said conductive sections enabling electrical connection between said electrode terminals of said wiring board and said electrode terminals of said semiconductor device, and
said conductive sections constituting heat conductive channels between said wiring board and said semiconductor device; whereby said semiconductor device is mounted to said wiring board by said adhesive sheet.

2. The high-density mounted device according to claim 1, wherein said conductive sections of said adhesive sheet are made of copper.

3. The high-density mounted device according to claim 1, wherein each of said conductive sections of said adhesive sheet is formed into a cylindrical shape, and a cylindrical insulation section is formed around the circumferential surface of each respective cylindrical conductive section and electrically insulates each said cylindrical conductive section from adjacent conductive sections.

4. The high-density mounted device according to claim 1, wherein said wiring board and said adhesive sheet, and said semiconductor device and said adhesive sheet, are fixed together by heating at a predetermined temperature and under predetermined pressure.

5. A high-density mounted device, comprising:

a wiring board having a plurality of electrode terminals on an external surface thereof;

a plurality of semiconductor devices each having a plurality of electrode terminals and at least a ground terminal, and an adhesive sheet interposed between said wiring board and said plurality of semiconductor devices, said adhesive sheet including a sheet-like adhesive base member and a plurality of conductive sections provided at predetermined pitches in said sheet-like adhesive base member, said conductive sections extending from one side of said sheet-like adhesive base member to the other side thereof, said conductive sections being electrically insulated from each other, said conductive sections enabling electrical connection between said electrode terminals of said wiring board and said electrode terminals of said plurality of semiconductor devices, and said conductive sections enabling electrical connection between said ground terminals of said wiring board and said ground terminals of said plurality of semiconductor devices, and said conductive sections constituting heat conductive channels between said wiring board and said plurality of semiconductor devices; whereby said plurality of semiconductor devices is mounted to said wiring board by said adhesive sheet.

6. The high-density mounted device according to claim 5, wherein said conductive sections of said adhesive sheet are made of copper.

7. The high-density mounted device according to claim 5, wherein each of said conductive Sections of said adhesive sheet is formed into a cylindrical shape, and a cylindrical insulation section is formed along the circumferential surface of respective cylindrical conductive section and electrically insulates said cylindrical conductive section from adjacent conductive sections.

8. The high-density mounted device according to claim 5, wherein a selected number of said electrodes of said wiring board are electrically connected to each other on said wiring board to constitute a ground terminal.

9. The high-density mounted device according to claim 8, wherein said selected number of said electrodes of said wiring board are connected in parallel through a selected number of said conductive sections of said adhesive sheet to a ground terminal of said semiconductor devices.

10. The high-density mounted device according to claim 5, wherein said wiring board and said adhesive sheet, and said semiconductor devices and said adhesive sheet, are fixed together by heating at a predetermined temperature and under predetermined pressure.

* * * * *